(12) United States Patent
Hartwell et al.

(10) Patent No.: US 7,808,061 B2
(45) Date of Patent: Oct. 5, 2010

(54) MULTI-DIE APPARATUS INCLUDING MOVEABLE PORTIONS

(75) Inventors: Peter Hartwell, Sunnyvale, CA (US); Carl Picciotto, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 975 days.

(21) Appl. No.: 11/495,363

(22) Filed: Jul. 28, 2006

(65) Prior Publication Data

US 2008/0023813 A1    Jan. 31, 2008

(51) Int. Cl.
  *H01L 29/82* (2006.01)
(52) U.S. Cl. ...................................... 257/418; 257/417
(58) Field of Classification Search .................. 257/415, 257/416, 417, 418
  See application file for complete search history.

(56) References Cited

U.S. PATENT DOCUMENTS

| | | | |
|---|---|---|---|
| 5,006,487 A | 4/1991 | Stokes | |
| 5,557,596 A | 9/1996 | Gibson et al. | |
| 5,986,596 A | 11/1999 | Hoen et al. | |
| 6,105,427 A | 8/2000 | Stewart et al. | |
| 6,436,794 B1 | 8/2002 | Lee et al. | |
| 6,440,794 B1 | 8/2002 | Lee et al. | |
| 6,440,820 B1 | 8/2002 | Lee et al. | |
| 6,465,355 B1 | 10/2002 | Horsley | |
| 6,472,887 B1 | 10/2002 | Tullis et al. | |
| 6,474,162 B1 | 11/2002 | Voss et al. | |
| 6,504,385 B2 | 1/2003 | Hartwell et al. | |
| 6,509,620 B2 | 1/2003 | Hartwell et al. | |
| 6,511,894 B2 | 1/2003 | Song | |
| 6,590,850 B2 | 7/2003 | Eldredge et al. | |
| 6,621,096 B2 | 9/2003 | Lee et al. | |
| 6,657,444 B2 | 12/2003 | Fasen | |
| 6,664,193 B2 | 12/2003 | Lee et al. | |
| 6,747,863 B2 | 6/2004 | Fasen | |
| 6,776,042 B2 | 8/2004 | Pike et al. | |
| 6,784,592 B2 | 8/2004 | Hartwell | |
| 6,784,593 B2 | 8/2004 | Hartwell | |
| 6,784,630 B2 | 8/2004 | Hartwell | |
| 6,930,368 B2 * | 8/2005 | Hartwell et al. | 257/418 |
| 6,955,976 B2 | 10/2005 | Hartwell et al. | |
| 2002/0171326 A1 | 11/2002 | Hartwell | |
| 2003/0016613 A1 | 1/2003 | Raese | |
| 2003/0133372 A1 | 7/2003 | Fasen et al. | |
| 2003/0166310 A1 | 9/2003 | Caplet | |
| 2003/0222430 A1 | 12/2003 | Walmsley et al. | |
| 2005/0023547 A1 | 2/2005 | Hartwell et al. | |
| 2006/0110070 A1 | 5/2006 | Picciotto et al. | |
| 2006/0130955 A1 | 6/2006 | Picciotto et al. | |
| 2006/0131677 A1 | 6/2006 | Picciotto et al. | |
| 2006/0131714 A1 | 6/2006 | Picciotto et al. | |
| 2006/0134869 A1 | 6/2006 | Picciotto et al. | |

OTHER PUBLICATIONS

Hoen, S. et al., "A High-Performance Dipole Surface for Large Travel and Force", 12th International Conf. on Transducers, vol. 1, p. 344-347, Jun. 2003, Abstract only.

Krause, C., "Microcantilevers: ORNL's Sensors With Sensitivity", Oct. 7, 1996.

\* cited by examiner

*Primary Examiner*—Leonardo Andújar

(57) ABSTRACT

An electronic apparatus includes a first die, a second die, a third die, and a fourth die, wherein a portion of the second die and a portion of the third die are movably connected between the first die and the fourth die.

32 Claims, 6 Drawing Sheets

MULTI-DIE APPARATUS INCLUDING MOVEABLE PORTIONS

BACKGROUND

Micro Electro-Mechanical Systems (MEMS) are a combination of micro mechanical and micro electronic systems that are revolutionizing many different types of products by bringing together these systems. A MEMS device typically comprises a moveable micro mechanical structure and silicon based microelectronics. One type of known MEMS device is a MEMS transducer. For example, capacitive MEMS transducer may be used in air-bag systems for crash detection. A crash is detected by monitoring the movement of the mechanical structure in the MEMS transducer using associated microelectronics in the MEMS transducer. The mechanical structure in the transducer comprises a single, moveable, capacitive plate which is relative to another, non-moving, capacitive plate in the transducer. As the mechanical structure moves, a change in capacitance is caused by the displacement of the capacitive plate. This change in capacitance is detected by the microelectronics and used to activate the air bag.

Generally, the mechanical structure of these transducers is created by depositing a poly-silicon layer on a silicon wafer, which is typically only a few microns thick. Because of the limited thickness of the mechanical structure, the mechanical structure suffers from performance limitations. For example, because of the minimal thickness of the mechanical structure, it is difficult to restrict the movement of the mechanical structure to the desired plane. This results in the microelectronics detecting movement in the desired plane as well as movement out of the desired plane, which results in crosstalk and generally results in performance degradation.

Other conventional MEMS devices typically comprise two chips wired together. In these MEMS devices, one chip includes the micro mechanical structure and the other chip includes the micro electronic structure. These two chips are manufactured separately and wired-bonded together. This results in performance degradation and increased costs. For example, stray capacitances are introduced due to the necessity of wire-bonding the two chips together. Also, typically these two chips are packaged together as a single device, which further increases costs.

BRIEF DESCRIPTION OF THE DRAWINGS

Embodiments are illustrated by way of example and not limitation in the accompanying figures in which like numeral references refer to like elements, and wherein.

DETAILED DESCRIPTION

For simplicity and illustrative purposes, the principles of the embodiments are described. However, one of ordinary skill in the art would readily recognize that the same principles are equally applicable to, and can be implemented with variations that do not depart from the true spirit and scope of the embodiments. Moreover, in the following detailed description, references are made to the accompanying figures, which illustrate specific embodiments.

Figure 1:
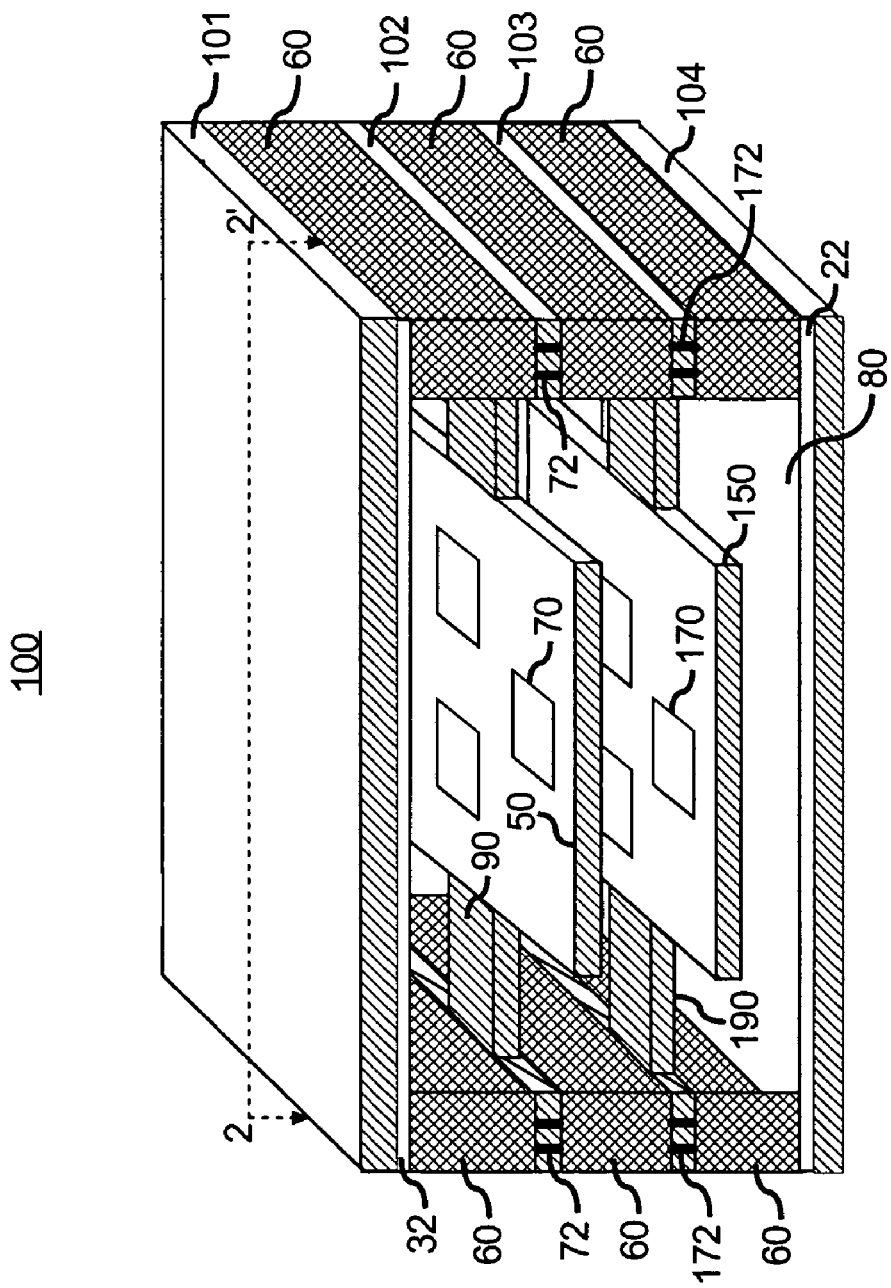
FIG. 1 illustrates a perspective view of a MEMS device, according to an embodiment.

Referring to FIG. 1, there is shown a perspective view of a MEMS device 100, also referred to as a MEMS apparatus, according to an embodiment. The device 100 includes a cap die 101 and a lower die 104. The device 100 also includes two mechanical dies 102 and 103 positioned between the cap die 101 and the lower die 104. A material 60 bonds the cap die 101, the middle dies 102 and 103, and the lower die 104 together to form a single chip. The material 60 also seals the device 100. A cavity 80 is formed between the cap die 101 and the lower die 104. The cavity 80 is sealed by the material 60. The material 60 may comprise a die bonding material, or the like. The dies 101-104 thus form the first, second, third and fourth dies, respectively, of the device 100. One of ordinary skill in the art will recognize that additional dies, although not shown in FIG. 1, may also be used to fabricate the device 100 or other MEMS device.

The device 100 may comprise a single chip including the four dies 101-104 connected together in a stacked arrangement. As shown in FIG. 1, the stacked arrangement may include the first die 101 at the top of the device 100. Successively below the first die 101 are the dies 102-104 respectively. The second and third dies 102 and 103 are interposed between the first die 101 and the fourth die 104. The second die 102 includes a moveable portion 50 and the third die 103 includes a moveable portion 150. The four dies 101-104 are connected together using the bonding material 60.

The moveable portion 50 of the second die 102 is capable of moving relative to the cap die 101 and the lower die 104, for instance, by changing position relative to the position of the upper die 101 and the lower die 104. The moveable portion 50 of the second die 102 is also capable of moving relative to the second moveable portion 150 within the cavity 80. In like manner, the second moveable portion 150 is capable of moving and thus changing position relative to the upper die 101 and the lower die 104 and also relative to the moveable portion 50 within the cavity 80.

In one example of a manufacturing process, the second die 102 may be trenched to form the moveable portion 50. Flexures 90 couple the moveable portion 50 to the remaining portion of the die 102. The flexures 90 allow the moveable portion 50 to move in a desired direction relative to the dies 104 and 101 and relative to the second moveable portion 150 within the cavity 80. For example, the flexures 90 may be designed to allow the moveable portion 50 to move in any of the x, y, or z directions or combination of any of those directions. The flexures 90 may also be formed from the second die 102 by etching, such as plasma etching or reactive ion etching, or other known micromachining processes.

The third die 103 may be trenched to form the second moveable portion 150. Flexures 190 couple the second moveable portion 150 to the remaining portion of the third die 103. The flexures 190 allow the second moveable portion 150 to move in a desired direction relative to the dies 104 and 101 and relative to the moveable portion 50 within the cavity 80. For example, the flexures 190 may be designed to allow the second moveable portion 150 to move in any of the X, Y or Z directions or combination of any of those directions. The flexures 190 may be formed from the third die 103.

The moveable portion 50 moves within the cavity 80 of the device 100. The second moveable portion 150 also moves within the cavity 80 of the device 100. The moveable portion 50 and the second moveable portion 150 may move in the same directions or in different directions within the cavity 80. In one embodiment, the positions of the moveable portions 50 and 150 is sensed using the electrodes 70 and 170, as described in further detail below. In another embodiment, the electrodes 70 and 170 are included in actuators operable to move or hold in place one or more of the moveable portions 50 and 150, also described in further detail below. Also, electrodes may be provided for position sensing of moveable portions and as actuators for moving or holding in place moveable portions in another embodiment.

The MEMS device 100 is shown with the material 60 being significantly thicker than the dies 101-104 for purposes of illustrating all the features of the MEMS device 100. It will be apparent to one of ordinary skill in the art that the thickness of the material 60 and the dies 101-104 may have proportions other than shown in FIG. 1. In one embodiment, the thickness of the material 60 between the third die 103 and the lower die 104 (which is approximately equal to the gap between the dies), for example, may be approximately 0.1 to 10 microns. Similarly, the thickness of the material 60 between the second die 102 and the cap die 101, for example, may be approximately 0.1 to 10 microns. Furthermore, the thickness of a die is typically 500-600 microns thick. The second die 102 may have a thickness of approximately 300 microns or less for forming vias 72. Similarly, the third die 103 may have a thickness of approximately 300 microns or less for forming the vias 172. Circuits may be in electrical communication even if distributed on multiple dies using vias, such as the vias 72 and 172 and other vias described herein. By reducing the thickness of the second die 102 and the third die 103, respectively, the manufacturing process for creating the corresponding vias 72 and the vias 172 as well as the flexures 90 and 190 becomes less difficult. The thicknesses described above are examples of thicknesses for various components of the MEMS device 100 and other thicknesses may be used as is known in the art.

The cavity 80 is sealed by the material 60. The cavity 80 may include a vacuum or may include a dielectric, such as a gas, fluid, or inert gas. Examples of the inert gas include Argon, Helium, Nitrogen, and the like. Also, a hermetic seal operable to substantially prevent moisture from entering the MEMS device 100 may be created from the material 60 and/or using other materials and seals.

The MEMS device 100 may also include at least one via 72 in the second die 102 which conducts electrical signals through the second die 102, and at least one via 172 in the third die 103 which conducts electrical signals through the third die 103. For example, electrical signals may be transmitted from a circuit 32 on the cap die 101 to a circuit 22 on the lower die 104 or vice versa through the vias 72 and the vias 172. The bonding material 60 may be conductive or the bonding material 60 may provide signal interconnection through a patterned conductive region or through bonding posts.

The vias 72 and the vias 172 may also be used to transmit signals to a circuit on a surface of either the second die 102 or the third die 103 from either of the dies 104 and 101. For example, the circuit 22 can transmit signals to the electrodes 70 on an upper surface of the second die 102, and the circuit 32 may transmit signals to electrodes 52 (shown in FIG. 2) on a lower surface of the second die 102. Similarly, the circuit 22 can transmit signals to the electrodes 170 on an upper surface of the third die 103, and the circuit 32 may transmit signals to electrodes 152 (shown in FIG. 2) on a lower surface of the third die 103. The circuits 22 and 32 and the electrodes 52 and 152 are shown to illustrate that the vias 72 and 172 may be used to transmit signals to a component on a surface of the moveable portion 50, a component on a surface of the second moveable portion 150, or to a component on the cap die 101 or the lower die 104.

Furthermore, conductors (not shown), for example, running along the flexures 90, may be used to connect circuits on the moveable portion 50 of the second die 102 to the vias 72. In like manner, conductors (not shown) running along the flexures 190 may be used to connect circuits on the second moveable portion 150 of the third die 103 to the vias 172. It will be apparent to one of ordinary skill in the art that in various embodiments, one or more of the circuits 22 and 32 and the electrodes 70, 170, 52 and 152 may optionally be used depending on the design of the MEMS device 100 for any particular application. Furthermore, a circuit, as described herein, comprises passive components (for instance, capacitors, inductors, resistors, electrodes, etc.) or active components (for instance, transistors, etc.), or a combination thereof. Electrodes 70 and 52 are shown as being provided on surfaces of the second die 102, and electrodes 170 and 152 are shown as being provided on surfaces of the third die 103, however, a circuit including active and/or passive components may be provided on any of these surfaces. In addition, a circuit may include components on more than one die. For example, components of the circuit 22 may also be provided on the cap die 101, and these components may communicate through the vias 72 and 172. In another example, the circuit 32 includes components comprising components on the circuit 32 and the electrodes 70, and the components interact through the cavity 80.

It will be apparent to one of ordinary skill in the art that wafers may be used to create many of the devices 100 or other MEMS devices described herein simultaneously, and then the devices are cut and packaged. Also, a die may include a portion of a wafer. For example, the dies 101-104 may be created using a conventional die-cutting process that cuts a wafer to create a die.

Figure 2:
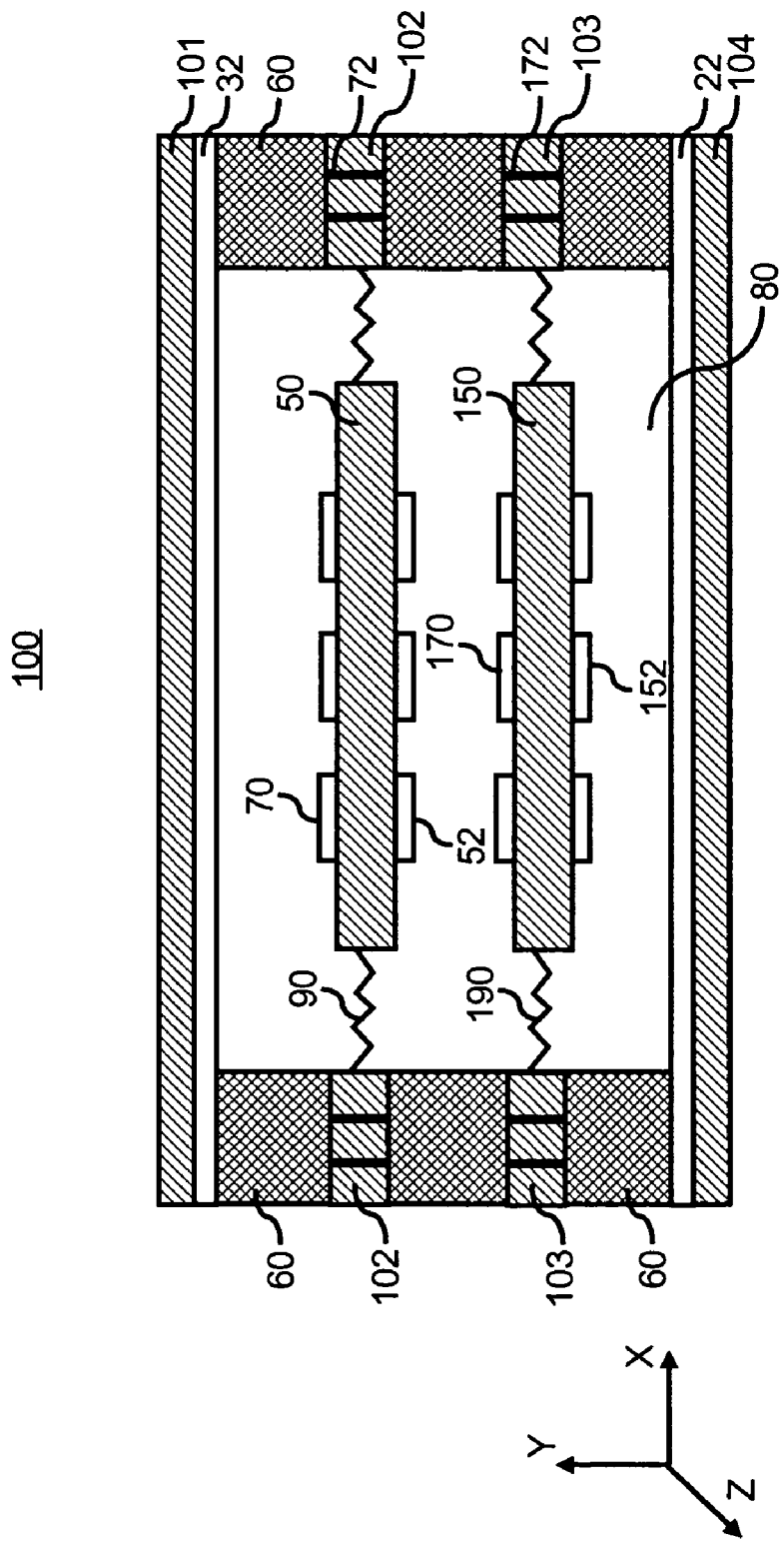
FIG. 2 illustrates a cross-section of the MEMS device of FIG. 1.

FIG. 2 illustrates a cross-section of the MEMS device 100, shown in FIG. 1, taken across the line 2-2' shown in FIG. 1. The vias 72 and 172 and other components of the MEMS device 100 are illustrated in FIG. 2. In one embodiment, the vias 72 and 172 may each include the die substrate (for instance, silicon or a polysilicon) surrounded by an insulator. The die substrate may be conductive, so it may be used as a conductor for the vias 72 and 172 to pass signals through the dies 102 and 103, respectively. An insulator is used for each of the vias 72 and 172 to create more than one via in the corresponding dies 102 and 103 by isolating the conductors forming the vias 72 and 172. In another embodiment, an insulator may be filled with metal to form a via in the die 102 or the die 103.

Although FIGS. 1 and 2 illustrate a particular number of the electrodes 70, 170, 52, and 152 on the moveable portions 50 and 150, the number of electrodes shown is for illustrative purposes and it is to be understood that any suitable number of electrodes may be used with the MEMS device 100, and with the other MEMS devices shown and described below, with reference to FIGS. 3A-6, as needed. For example, a different number of electrodes is shown for the MEMS devices depicted in FIGS. 3A-6, as compared to the number of electrodes shown for the MEMS device 100 shown in FIGS. 1 and 2. A greater or lesser number of electrodes may be used, as needed. In addition, the arrangement and configuration of the electrodes on the surfaces of the moveable portions 50 and 150 of the MEMS device 100 may also vary, as needed.

In addition, the electrodes of the MEMS device 100 shown in FIGS. 1 and 2 may have different functions. For example, the electrodes 70, 170, 52 and 152 may function as a capacitive plate for position detection and/or the electrodes 70, 170, 52 and 152 may function as part of an actuator. An actuator is a component of a MEMS device operable to control movement of a moveable portion of a MEMS device.

According to one embodiment, a MEMS device, such as the MEMS device 100, may operate as a sensor or MEMS transducer device, wherein the sensor includes electrodes that function as capacitive plates for position detection. The capacitive plates operate to detect a change in the position of one or more of the moveable portions. Equation 1 may be used to calculate a change in capacitance between electrodes, where $\in$ is the dielectric constant.

$$C=(\in *A)/d \qquad \text{Equation (1)}$$

A is the overlap between electrodes in the x and y direction and d is the distance between electrodes in the z direction. The capacitance changes either with a change in distance, d, between electrodes in the z direction or with a change in the overlap A. The distance, d, or the overlap, A, may be allowed to vary depending on how the flexures 90 and 190 are designed to allow motion. For example, the flexures may be designed to allow motion in one or more of the x, y and z directions.

Figure 3A:
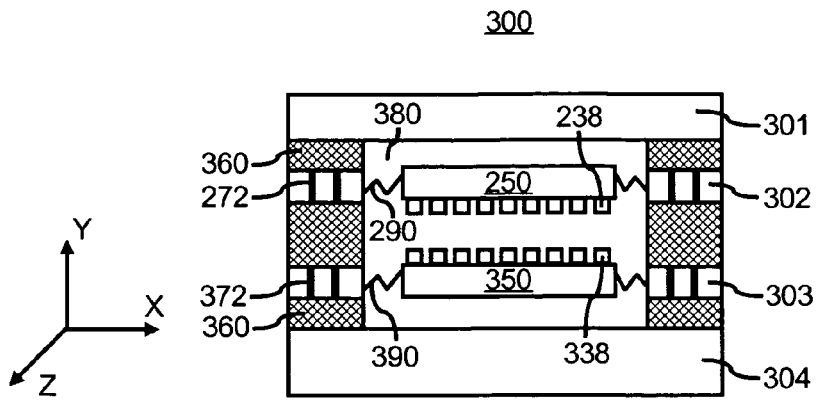
FIGS. 3A-D illustrate cross-sections of MEMS devices, according to embodiments.
Figure 3B:
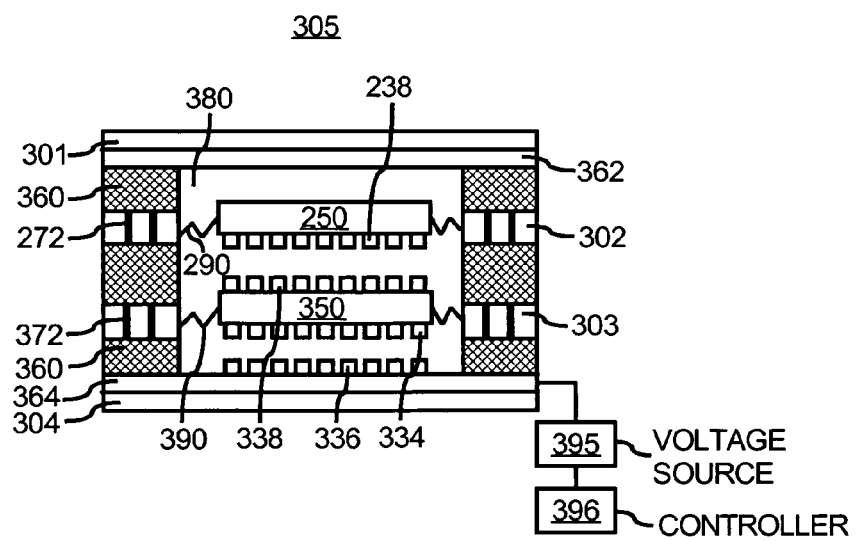
Figure 3C:
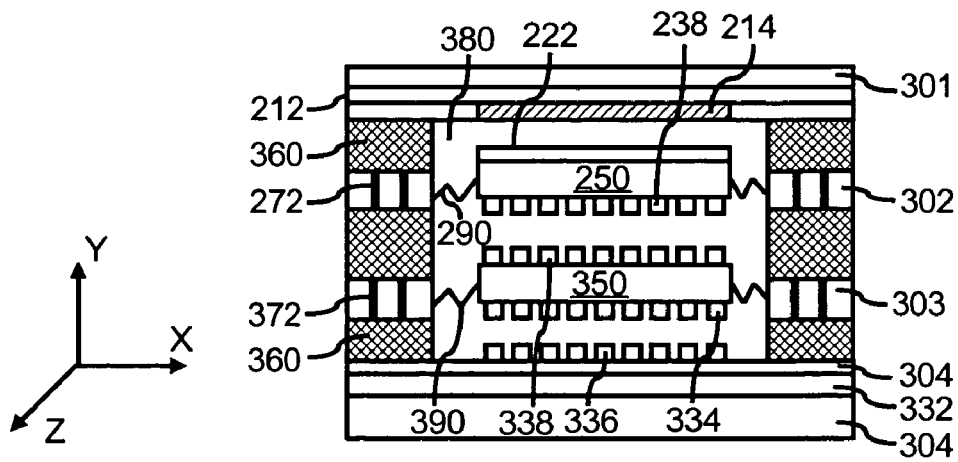
Figure 3D:
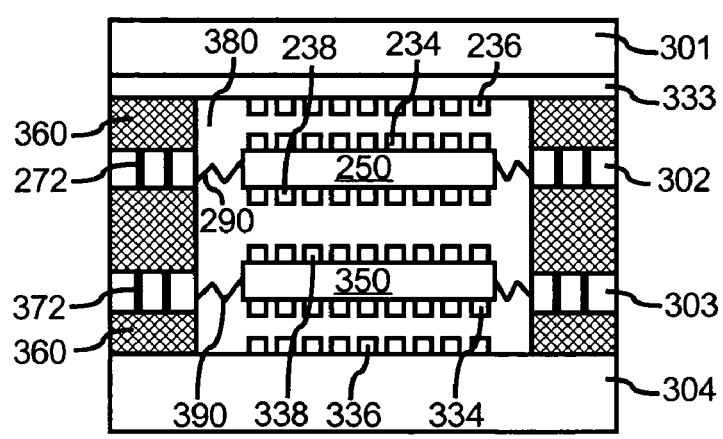

Electrodes may be provided on dies 101 and 104, shown for example as 236 and 336 on dies 301 and 304 in FIG. 3D. Using electrodes on dies 101 and 104, the motion of the moveable portion 50 may be measured relative to the stationary die 101 and the motion of the moveable portion 150 may be measured relative to the stationary die 104. If the moveable portions 50 and 150 are identical except for having a different mass, the moveable portions 50 and 150 respond differently to an external force.

The MEMS transducer device, such as the MEMS device 100, may also provide both position determination and actuator functions, as described in further detail below. Thus, the electrodes of the MEMS transducer device may function for position sensing of one or more of the moveable portions and as actuators for controlling the movement of one or more of the moveable portions of the MEMS device.

According to another embodiment, as described in further detail below, for example, with reference to FIG. 3B, a MEMS device may operate as a MEMS data storage device, wherein data may be written onto a specific location of a storage medium located on one of the moveable portions of the MEMS device. Electrodes of the MEMS data storage device may thus be included in actuators operable to move or hold in place a moveable portion such that data may be written onto a specific location of a storage medium located on the moveable portion. The MEMS data storage device may also provide both position determination and actuator functions, as further described in detail below. The electrodes of the MEMS data storage device may thus be provided for position sensing of one or more moveable portions and as actuators for moving or holding in place one or more of the moveable portions.

The MEMS device 100 may be used as a transducer or as a storage device as described herein. One of ordinary skill in the art will recognize that the MEMS device 100 may be used for other applications as well. Furthermore, the different embodiments of the multi-die structures shown in FIGS. 1-6 may be applied to a MEMS transducer, a MEMS storage device, or a MEMS device used for other applications.

Referring to FIG. 3A, a cross-section of a MEMS transducer device 300 is shown, according to an embodiment, which incorporates many of the features of the MEMS device 100 shown in FIGS. 1 and 2. The MEMS transducer device 300 includes four dies. The four dies include, for example, an upper die 301 also referred to as a cap die, dies with movable portions, referred to as the mechanical dies 302 and 303, also referred to as the second and third dies, and a lower die 304. The dies 301-304 are bonded and sealed, for example, using the bonding material 360. In one example, each of the mechanical dies 302 and 303, for instance, approximately 20-300 microns thick, may be much thinner than the upper die 301 and the lower die 304, for instance, which may be approximately 500-600 microns thick. In another example, the mechanical dies 302 and 303 may have the same or similar thickness of the dies 301 and 304.

The second die 302 includes a moveable portion 250, and the third die 303 includes a second moveable portion 350. The moveable portion 250 of the second die 302 is capable of moving relative to the upper and lower dies 301 and 304 and also relative to the second moveable portion 350 within the cavity 380. In addition, the second moveable portion 350 is capable of moving relative to the upper and lower dies 301 and 304 and also relative to the moveable portion 250 within the cavity 380.

Electrodes 238 are provided on a lower surface of the moveable portion 250 and electrodes 338 are provided on an upper surface of the second moveable portion 350, across from the electrodes 238.

In one example, in a system with two moveable elements, such as the MEMS transducer device 300 which includes the moveable portions 250 and 350, the moveable portions may either move in the same direction, or in opposite directions, in either of the x, y or z directions. If the two moveable portions 250 and 350 move in the same direction, but not to the same extent or magnitude in the same direction, the position-sensing electrodes 238 and 338 may determine the extent of movement of each of the moveable portions 250 and 350 by determining the change in capacitance. Also, if the two moveable portions 250 and 350 move in opposite directions, the position-sensing electrodes 238 and 338 may also determine the extent of movement of each of the moveable portions 250 and 350 relative to each other. In addition, either or both of the moveable portions 250 and 350 may also be held in position with at least one actuator.

The MEMS transducer device 300 may thus be used as a transducer or sensor, where the movement of the moveable portions 250 and 350 relative to each other are sensed. Thus, the position of one of the moveable portions 250 and 350 may be determined relative to the position of the other of the moveable portions 250 and 350 with a sensor that includes the electrodes 238 and 338 which function as capacitive plates located on the respective moveable portions 250 and 350. The electrodes 238 and 338 included in the sensor are thus used to determine a change in capacitance when one or both of the moveable portions 250, 350 changes position by moving in the same direction or in opposite directions. In addition, the moveable portions 250 and 350 may be moved relative to each other or held in position relative to each other with at least one actuator including the electrodes 238 and 338, as described in further detail below.

In one example, movement of the moveable portions 250 and 350 may be caused by an external force. In this example, the MEMS sensor may include the electrodes 238 and 338 on both of the moveable portions 250 and 350 for detecting the movement of the moveable portions 250 and 350 relative to each other. In this example, the electrodes 238 and 338 are used to detect the position of the electrodes 238 and 338 rather than being used as actuators such as described below. The moveable portions 250 and 350 may be capable of moving in any of the x, y, and z directions, such as in response to the external force. In addition, in response to the external force, for example, the moveable portions 250 and 350 may move either in the same direction, or in opposite directions.

As either of the moveable portions 250 and 350 move in response to the external force, the electrodes 238 on the moveable portion 250 and the electrodes 338 on the second moveable portion 350, move relative to each other, causing a change in capacitance between the electrodes 238 and 338. Movement of the MEMS device 300 in the x and/or y direction in response to the external force is detected by measuring the change in overlap between the electrodes 238 and 338. A greater number of electrodes 238 and 338 may also produce a greater degree of resolution, with regard to detecting or sensing a change in the relative position of the two moveable portions 250 and 350.

Movement in the z direction, in response to the external force, may also be determined using the electrodes 238 and 338. For example, the capacitance between one of the electrodes 238, located on the moveable portion 250, and one of the electrodes 338, located on the second moveable portion 350, changes as the gap between the electrodes 238 and 338 changes with movement in the z-direction. The number, size and/or shape of either the electrodes 238 and 338, or both, may be varied as needed or desired, to effect greater detection and resolution of movement in either the x, y or z directions.

The movement of the two moveable portions 250 and 350 may also depend on the type, and other physical characteristics, of the flexure springs 290 and 390 that are used, respectively. If the two moveable portions 250 and 350 have approximately the same mass and approximately the same spring constant, when attached to their respective flexures 290 and 390, then the two moveable portions 250 and 350 should move nearly the same, or in an identical manner, in response to an external stimulus, such as an external force.

Alternatively, if the two moveable portions 250 and 350 have different masses, or if the spring or suspension, such as by attachment to the flexures 290 or 390, differs when compared between the two moveable portions 250 and 350, then the two moveable portions 250 and 350 may respond in a different manner in response to the external stimulus. In addition, although the flexures 290 and 390 are shown as having one particular point of attachment, the flexures 290 and 390 may alternatively have other points of attachment, for attaching the two moveable portions 250 and 350 to the respective dies 302 and 303. In addition, although the two moveable portions 250 and 350 are depicted as having a particular shape and relative size, as shown in FIG. 3A, the two moveable portions 250 and 350 may also have different sizes and shapes, as needed or desired.

The die-to-die bonds between the dies 301-304 form an internal cavity 380 which may be sealed at high vacuum. The bonding material 360 seals the cavity 380 to maintain the vacuum in the cavity 380. The bonding material 360 may comprise ultra-high vacuum (UHV) seals and/or other known materials for maintaining the internal environment of the MEMS transducer device 300. The cavity 380 may include a dielectric sealed in the cavity 380 to allow the electrodes 238 and 338 to function as capacitive plates for determining change in capacitance to detect the movement of the moveable portions 250 and 350.

FIG. 3B illustrates another four-die embodiment of a MEMS transducer device 305. The MEMS transducer device 305 includes, in addition to the electrodes 238 and 338, the electrodes 334 and 336 which may be used for actuators and/or sensors. The electrodes 334 and 336 may be included for either position-sensing, such as sensing the position of the moveable portions 250 or 350, or for actuators to either hold the position or control the movement of the moveable portions 250 or 350 or for both.

The number of electrodes 334 and 336 shown in FIG. 3B is for illustrative purposes, and it is to be understood that the electrodes 334 and 336 may include any multiple number of individual electrodes. In addition, the individual electrodes may be grouped together to form repeating patterns of electrodes covering much of the surface of the moveable portion 350. In addition to the electrodes 334 and 336, position-sensing and actuation of the moveable portions 250 and 350 may also utilize the electrodes 238 and 338, as described above, with reference to FIG. 3A. Although the electrodes 238, 334, 336 and 338 are shown in FIG. 3B as having a particular configuration and arrangement on the surfaces of the respective dies, the electrodes 238, 334, 336 and 338 may also be organized in a different arrangement or configuration, as needed or desired. The MEMS transducer device 305 may also include circuits 362 and 364, which are similar to or the same as the circuits 22 and 32 described with respect to FIGS. 1 and 2.

The MEMS transducer device 305 may include actuators including two or more of the electrodes 238, 334, 336 and 338 to hold one of the moveable portions 250 or 350 stationary so movement may be measured respective to a stationary component. For example, the actuator may comprise the electrodes 334 and 336 for holding the moveable portion 350 stationary. In response to an external force, the moveable portion 250 moves while the moveable portion 350 is stationary, and the movement may be measured using the electrodes 238 and 338.

The actuator may also include a voltage source 395. The voltage source 395 may be provided on the circuits 362 or 364 or may be provided as an external voltage source. In response to detecting an offset in the position of the moveable portion 250, such as an offset produced by the external force, the voltage source 390 may supply a voltage to the electrodes 334 and 336, to hold the position or control the movement of the moveable portion 350. The voltage is used to generate an electrostatic force between the electrodes 334 and 336 in the cavity 380 to hold the position or control the movement of the moveable portion 350. The voltage that is supplied may be based upon the magnitude of the detected offset in the position of the moveable portion 250.

A controller 396, which may be external or provided in one of the circuits 362 or 364, may be configured to control the magnitude of the voltage that is supplied by the voltage source 395. For example, the controller 396 may control the voltage that is supplied for the actuator by comparing the detected position of the moveable portion 250 with a previously determined baseline position, determining if there is an offset compared to the baseline position of the moveable portion 250, and supplying an appropriate voltage to correct for the detected offset. In this example, the offset determination may be provided as a feedback signal, and the transducer 305 operates as a closed-loop transducer. The voltage that is supplied may also be amplified, for example, by a buffer amplifier in the circuit 362 or 364 or external prior to reaching the actuator.

In addition, an actuator may be operated by application of a single voltage or by application of a pattern or series of voltages to the actuator. For example, a pattern or series of voltages may be applied to control the movement or hold a position of one or more of moveable portions in a specific spatial position, for instance, in response to an external force that is detected by the MEMS transducer device 300.

In another example, one or more actuators may be used to control the movement of one or more of the moveable portions 250 and 350 such that the moveable portions 250 and 350 are substantially parallel and substantially aligned with each other, in any of the x, y or z directions. Alternatively, one or more actuators may be used to control the movement of one or more of the moveable portions 250 and 350 such that the moveable portions 250 and 350 are less than substantially aligned, in any of the x, y or z directions. In addition, other circuitry or electronics (not shown), such as circuitry for connecting a MEMS device to one or more external devices or apparatuses, may also be included in the design and fabrication of one or more MEMS devices described herein. Also, an actuator may be used in the design and fabrication of one or more MEMS devices described herein.

Although not shown for all the embodiments, the voltage source 395 and the controller 396 may be used in one or more of the embodiments described herein for use in one or more actuators in the MEMS devices described herein.

Referring to FIG. 3C, a different configuration of a four-die MEMS device is shown as a MEMS data storage device 310. Examples of data storage operations using the MEMS data storage device 310 are described in detail below. The MEMS data storage device 310 includes electrodes 238, 338, 334 and 336. The electrodes 334 and 336 may be included for either position-sensing, such as sensing the position of the moveable portion 350, or for actuators to either hold the position or control the movement of the moveable portion 350.

The number of electrodes 334 and 336 shown in FIG. 3C is for illustrative purposes, and it is to be understood that the electrodes 334 and 336 may include any multiple number of individual electrodes. In addition, the individual electrodes may be grouped together to form repeating patterns of electrodes covering much of the surface of the moveable portion 350. In addition to the electrodes 334 and 336, position-sensing and actuation of the moveable portions 250 and 350 may also utilize the electrodes 238 and 338, as described above, with reference to FIG. 3A. Although the electrodes 238, 334, 336 and 338 are shown in FIG. 3C as having a particular configuration and arrangement on the surfaces of the respective dies, the electrodes 238, 334, 336 and 338 may also be organized in a different arrangement or configuration, as needed or desired.

The MEMS data storage device 310 may also include circuitry for reading or writing bits of data in storage media located on one or more surfaces of the moveable portions. The moveable portion 250 includes, for example, the storage media 222. To carry out data storage operations, one or more actuators including the shown electrodes may be used to control the movement of one or more of the moveable portions 250 and 350 to provide for the reading or writing of data bits in storage media.

In one example, one or more actuators may be used to hold the position of the moveable portions 250 or 350 in a specific spatial position at specific coordinates in the x, y and z directions or, alternatively, to move the moveable portions 250 or 350 to specific coordinates in the x, y and z directions, to read or write data bits in the storage media 222. The tip emitter electronics 212 and the field emitter tips 214 can be used to write data bits onto the storage media 222.

For example, once the moveable portion 350 is held in position, or moved to a desired position, by one or more actuators, bits of data may be written to the storage media 222 by operation of the tip emitter electronics 212 and the field emitter tips 214. The tip emitter electronics 212 may comprise one or more circuits formed on the cap die 301. Other circuitry or electronics (not shown) may also be provided on one or more of the dies 301-304 for controlling the reading and writing of data bits to the storage media 222. In addition, other storage media (not shown) may also be employed on one or more of the dies 301-304, in addition to the storage media 222 shown in FIG. 3B.

The tip emitter electronics 212 are connected to the field emitter tips 214. The field emitter tips 214, under the control of the tip emitter electronics 212, are operable to emit electron beams by drawing electrons off a metal in the field emitter tips 214 with a high electromagnetic field. Each beam may be focused on a specific location of the storage media 222 located on an upper surface of the moveable portion 250, across from the field emitter tips 214. The precise spatial position of the moveable portion 250 in the x, y and z directions may be controlled by one or more actuators including electrodes, as described above, such that the electron beams emitted by the field emitter tips 214 are focused precisely on a specific location of the storage media 222. The beams are thus focused and used to write data bits onto the storage media 222 by heating tiny data spots and altering the data spots physical state or phase. A beam may also be used to determine a data bit state (value) in the storage media 222. The storage media 222 may also include medium recording cells (not shown) for storing bits of data in the MEMS data storage device 310. The tips 214 may alternatively be placed on a moveable portion, such as the moveable portion 250, and the storage media 222 may be placed on a stationary portion, such as the die 301.

Referring to FIG. 3C, the read/write (R/W) electronics 332, which may comprise one or more circuits, may also be used to control reading or writing of data bits in the storage media 222, and to access data bits in the storage media 222 to determine data bit values. The R/W electronics 332 may also be used, with at least one or more actuators as described in detail above, to control with nanometer precision the movement of the moveable portions 250 or 350. Additional electronics and circuitry (not shown) may also be included in the MEMS data storage device 310 for reading or writing of data bits in one or more storage media, including the storage media 222 located on the upper surface of the moveable portion 250.

The R/W electronics 332 may also energize the electrodes 238 to one of two voltage states in a pattern. The individual electrodes may repeat this pattern across the moveable portion 250. The position of the moveable portion 250 may thus be controlled and changed by changing the voltage pattern on the electrodes 238 in a particular order.

Instead of the field emitter tips 214, other R/W mechanisms may be used to write data bits onto one or more storage media, including the storage media 222. In one embodiment, optical emitters, for instance, laser emitters, LEDs, etc., may be used. The optical emitters, which also may be represented by the reference numeral 214, but which may be used instead of the field emitter tips, emit optical beams or photons. Similarly to the electron beams of the field emitter tips, the optical beams emitted by the laser emitters or optical emitters may be focused and used to write data bits onto the storage media 222 by heating tiny data spots and altering the data spots physical state or phase. In one example, the precise spatial position of the moveable portion 250 in the x, y and z directions may be controlled by one or more actuators including electrodes, as described above, such that the optical beams emitted by the optical emitters are focused precisely on a specific location of the storage media 222.

A beam may also be used to determine a data bit state (value) in the storage media 222. In yet another embodiment of a R/W mechanism, one or more micro-cantilevers, which also may be represented by 214, are used instead of the field emitter tips or optical emitters. The micro-cantilevers (not shown) may include, for instance, one or more heated cantilevers or piezoelectric cantilevers for interacting with the storage media 222 to read or write data from the storage media 222. Additional storage media (not shown) may also be included in the MEMS data storage device 310. For each embodiment, such as for the optical emitters or for one or more types of the micro-cantilevers, as described above, the tip emitter electronics 212 may be substituted with other circuitry or electronics that may be used to control the respective implementation of the R/W mechanism or mechanisms.

Also, the storage media 222 may be connected through circuitry (not shown) that is further connected through the vias 272 and 372 such that data bit values may be transmitted to the R/W electronics 332 located on the lower die 304. Also, the R/W electronics 332 may be connected through the vias 272 and 372 to the tip emitter electronics 212, or to the corresponding electronics for either the optical emitters or for the micro-cantilevers, such that the R/W electronics 332 may transmit signals to the tip emitter electronics 212 to control reading, writing and accessing bits on the storage media 222.

The R/W electronics 332 are shown in FIG. 3C as provided on the lower die 304. However, one or more circuits of the R/W electronics 332 may also be provided on the cap die 301. Similarly, one or more circuits of the tip emitter electronics 212 may be provided on the lower die 304 or on one or more of the mechanical dies 302 and 303. By using the vias 272 and 372, circuits may be in electrical communication even if distributed on multiple dies in the MEMS device 310. Furthermore, the MEMS device 310 is provided as a single chip. In addition, because a four-die structure is used in fabricating the MEMS device 310, rather than a single die structure, machining of the dies or wafers used to create the dies may be performed, for instance, by thinning of each of the mechanical dies 302 and 303 to approximately 100 microns, without significantly impacting the integrity of the dies. The machining of the dies of the four-die structure may be performed for the MEMS devices shown in FIGS. 1-6.

Referring to the alternate four-die configuration shown in FIG. 3D, wherein like-reference numerals are shown and described above with reference to FIGS. 3A-C, the additional electrodes 234 and 236 may provide additional function as actuators and/or sensors, as described above, with regard to controlling the movement or sensing the position, respectively, of the moveable portion 250. FIG. 3D also shows additional electronics 333, which may be used in conjunction with other circuitry or electronics for sensing or controlling the position of one or more of the moveable portions 250 and 350. In addition, circuitry may also be included for performing data storage operations, such as the reading and writing of data bits to storage media, as described above with reference to FIG. 3C.

As shown in FIG. 3D, the movable portions 250 and 350 are free to move. Electrodes 238 and 338 can be used to measure the motion of the movable portion 250 relative to the movable portion 350 or as an actuator to hold the movable portions 250 and 350 together or move them relative to each other. If there are no electrodes 234, 236 and 334, 336, then the movable portions 250 and 350 are free to move relative to, for example, a fixed frame, not shown. For example, the chip with the device 315 may be presumably mounted in a frame. Adding the electrodes 334 and 336 allows measuring or holding the movable portion 350 relative to the fixed frame. So if the movement of the moveable portion 350 is measurable relative to the frame and the movement of the moveable portion 250 is measurable relative to the moveable portion 250, then the movement of the moveable portion 250 relative to the fixed frame may also be determined. Also, the electrodes 234 and 236 may be used to control or monitor the movement of the moveable portion 250. So the device 315 allows for many variations on measuring and holding portions of the device 315, such as the following: measure 250 to fixed (234 and 236); measure 350 to fixed (334 and 336); measure 250 to 350 (238 and 338); hold 350 (334 and 336) and measure 250 (238 and 338) to fixed; hold 250 (234 and 236) and measure 350 (334 and 336) to fixed; measure 250 and 350 (234 and 236, 334 and 336, 238 and 338) to fixed and each other (may be used for high-performance, sensitive measurements in 2 different ranges depending on masses of 250 and 350); hold 250 to 350 (238 and 338) and measure motion (234 and 334) or (236 and 336).

The masses of the moveable portions may be the same or different depending on the movement being measured by the device 315 and also depending on the sensitivity of the measurement needed.

Figure 4A:
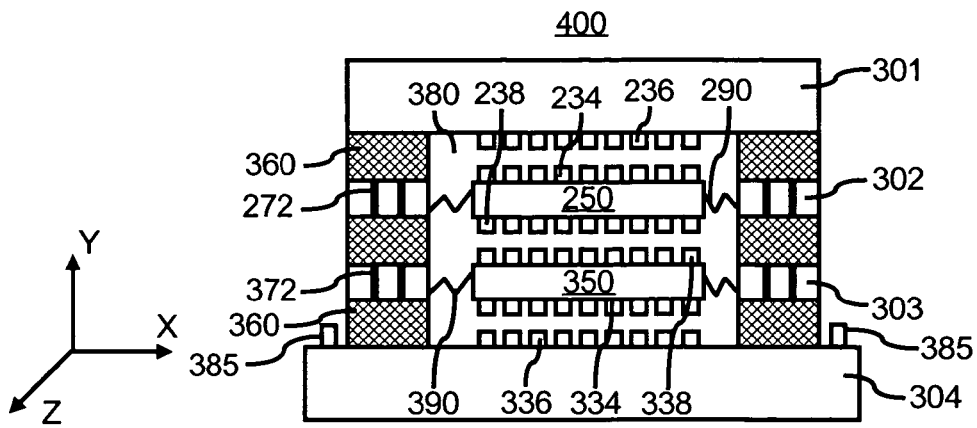
FIGS. 4A-C illustrate cross-sections of MEMS devices including external connections, according to embodiments.
Figure 4B:
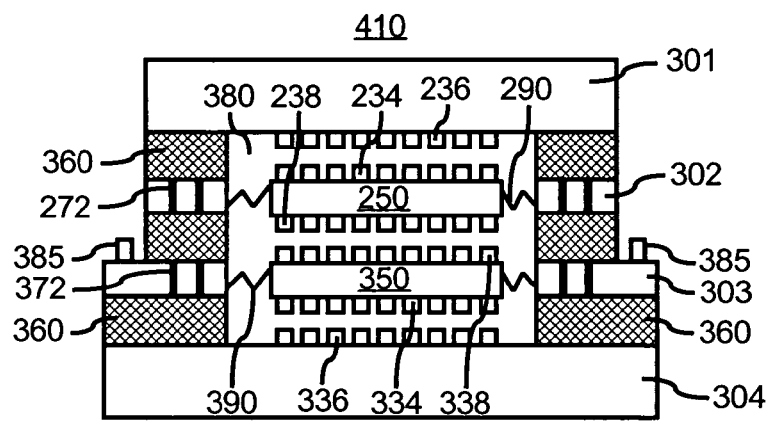
Figure 4C:
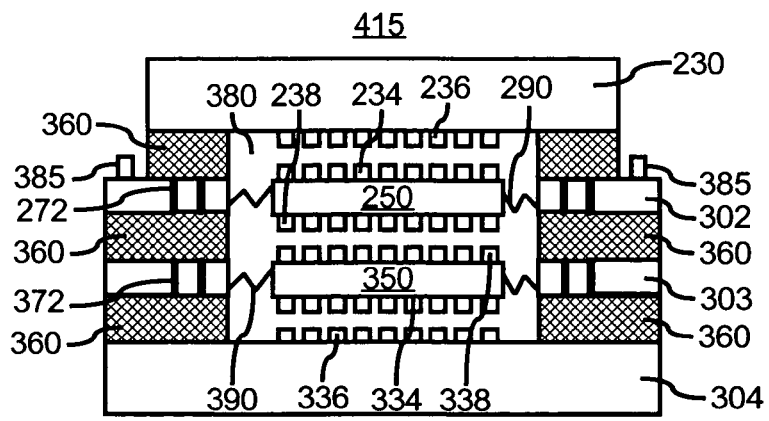

FIGS. 4A-C illustrate cross-sections of alternate four-die configurations of MEMS devices 400, 410 and 415, according to alternate embodiments, which incorporate many of the features of the MEMS devices shown in FIGS. 1-3D, and wherein like-referenced numerals are shown and described above, with regard to FIGS. 3A-3D. As described above, with reference to FIG. 3D, additional circuitry or electronics may also be provided for sensing or controlling the position of one or more of the moveable portions 250 and 350. Additional circuitry may also be included for performing one or more data storage operations, such as the reading and writing of data bits to storage media, as described with reference to FIG. 3C.

In addition, external bond pads or external connections 385 may be provided for making one or more connections to external devices, such as, wires and electrical components that are external to the respective devices 400, 410 and 415. The external connections 385 may be fabricated and positioned on a die, as shown in FIGS. 4B and 4C.

In the configuration 400 shown in FIG. 4A, the external connections 385 are fabricated on the lower die 304. In the configuration 410 shown in FIG. 4B, the external connections 385 are fabricated on the middle die 303. In the configuration 415 shown in FIG. 4C, the external connections 385 are fabricated on the middle die 302.

Figure 5A:
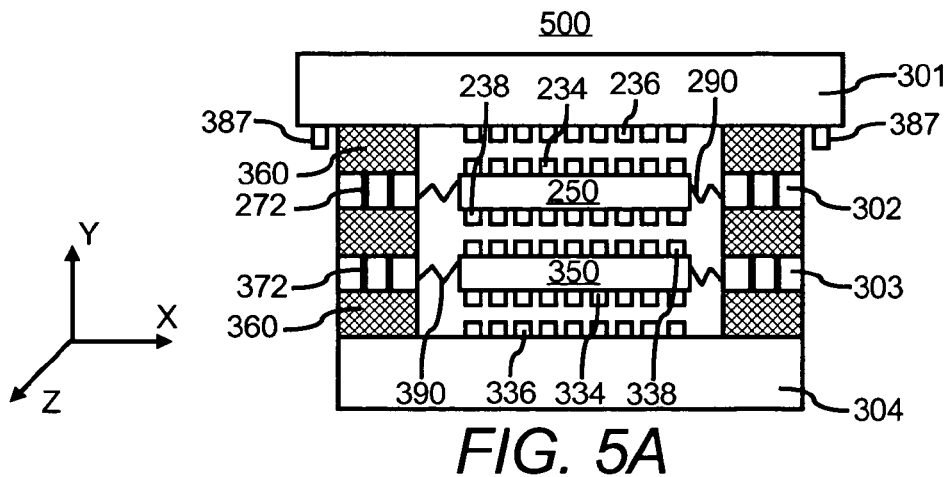
FIGS. 5A-B illustrate cross-sections of MEMS devices including alternative configurations of external connections, according to embodiments.

Referring to FIG. 5A, the MEMS device 500 is shown. The MEMS device 500 may operate as a transducer device, as a storage device, or as both a transducer device and a storage device, as described in detail above. As a transducer device, the MEMS device 500 may use electrodes to sense a change in capacitance, and thus to detect movement or a change in position of one or more of the moveable portions 250 and 350. One or more of the electrodes of the MEMS device 500 may also be included in actuators for controlling the movement of one or more of the moveable portions 250 and 350, such as for data storage operations, as described above with reference to FIG. 3B. In addition, a set of external connections or bond pads 387 may be provided near the cap die 301. The external connections or bond pads 387 may be connected to circuitry within the MEMS device 500, and may be used to electrically connect the circuitry the MEMS device 500 with one or more external elements, such as an external device. The position of the moveable portions 250 and 350 may also be controlled for a MEMS transducer device.

During a data storage operation, the respective flexures 290 and 390 may move in response to an actuator controlling the movement of the moveable portions 250 and 350. The flexures 290 and 390 may thus allow the moveable portions 250 and 350, respectively, to move in one or more of the x, y, or z directions. An actuator may also control the movement of the moveable portions 250 and 350 in response to an external force, and the flexures 290 and 390 may thus move accordingly in response to the actuator control.

As shown in FIG. 5A, the middle dies 302 and 303 are positioned between the upper die 301 and the lower die 304. The middle dies 302 and 303 are also connected to each of the upper die 301 and the lower die 304 with the material 360. The material 360 functions as a seal to seal a dielectric in the cavity 380. The seal may also be hermetic to keep moisture out of the cavity 380. The material 360 may include one or more types of suitable die bonding material. The four dies 301-304 are thus bonded and sealed to form a single four-die chip.

As a transducer device, the MEMS device 500 may include transducer electronics (not shown) which may comprise one or more circuits for calculating the change in overlap A and/or distance d between the electrodes shown in FIG. 5A. Alternatively, the transducer electronics may output a change in capacitance to an external circuit, for instance, by transmitting the output through the external connections 387, for calculating the change in overlap A and/or distance d. Using the above Equation 1, the distance d may be calculated from the change in capacitance between the electrodes shown in FIG. 5A, for instance, the change in capacitance between the electrodes 238 which are located opposite the electrodes 338, as described in detail above. Also, if d is known, the overlap A may also be calculated from the change in capacitance detected between the electrodes shown in FIG. 5A.

Also, in the embodiments described herein, electrodes may be placed on the MEMS devices such that the electrodes are only operable to sense a change in the distance, d, or a change in the overlap, A.

Figure 5B:
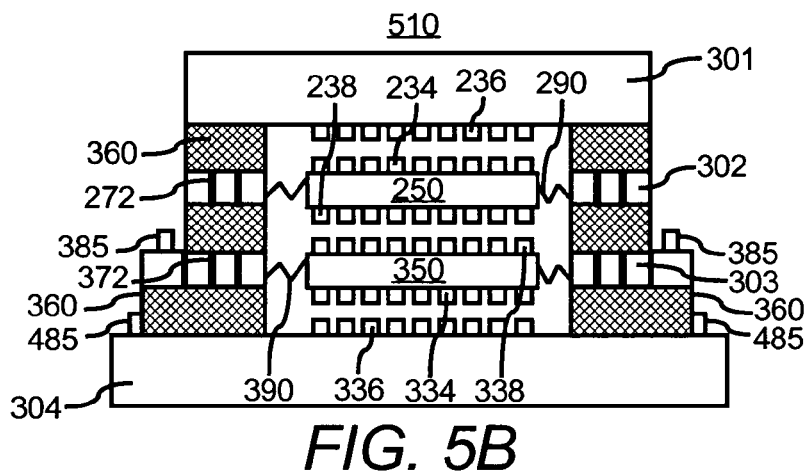

FIG. 5B illustrates a cross-section of another embodiment of a MEMS 510, which may also operate as both a transducer device and as a storage device, wherein two sets of external bond pads 385 and 485 are provided, which are supported by the respective dies 303 and 304. The MEMS device 510 may provide position-sensing, actuation, and data storage functions, similar to the functions of the MEMS devices shown and described above, with reference to FIGS. 4A-5A. Although not shown in FIG. 5B, transducer electronics may also be provided in one or more of the dies 301-304 for detecting changes in capacitance between sets of electrodes.

Figure 6:
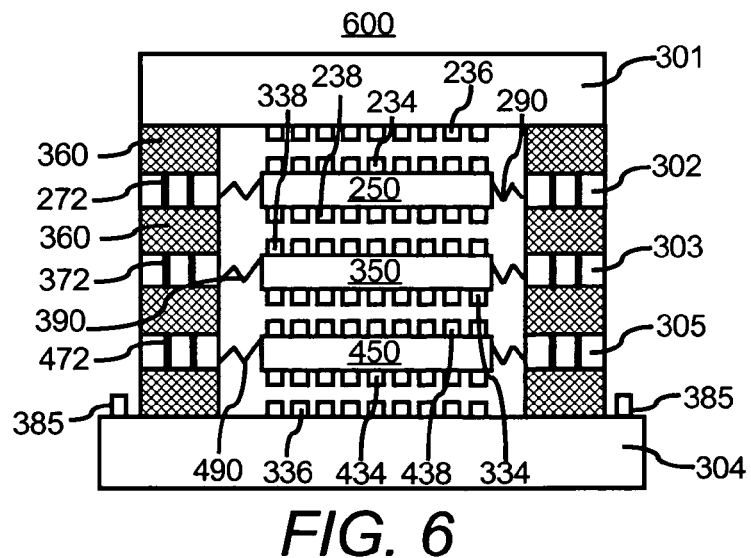
FIG. 6 illustrates cross-sections of MEMS device including more than two moveable dies, according to embodiments.

Referring to FIG. 6, another configuration of a MEMS device 600 is shown, comprising three moveable portions 250, 350 and 450, along with an additional set of vias 472 in the additional die 305, another set of flexures 490, and additional electrodes 434 and 438. The MEMS device 600 may also provide position-sensing, actuation, and data storage functions, similar to the functions of the MEMS devices shown and described above, with reference to FIGS. 4A-5B. As described above, with reference to FIGS. 1-5B, transducer electronics may also be provided for detecting changes in capacitance and for determining changes in the position of one or more of the three moveable portions 250, 350 and 450.

It will be apparent to one of ordinary skill in the art that more electrodes may be used or the size and shape of the electrodes may be varied for detecting change in capacitance in one or more of the x, y, and z directions. For example, in U.S. Pat. No. 6,504,385 by Hartwell et al., hereby incorporated by reference in its entirety, five electrodes and five counter electrodes are used to detect movement in the x, y, and z directions. Also, a lesser number of electrodes may also be used if movement in one or two directions is to be detected. Also, more than four dies may be stacked for a MEMS device.

What has been described and illustrated herein are embodiments along with some variations. While the embodiments have been described with reference to examples, those skilled in the art will be able to make various modifications to the described embodiments without departing from the true spirit and scope. The terms and descriptions used herein are set forth by way of illustration only and are not meant as limitations. In particular, although the methods have been described by examples, steps of the methods may be performed in different orders than illustrated or simultaneously. Those skilled in the art will recognize that these and other variations are possible within the spirit and scope as defined in the following claims and their equivalents.

What is claimed is:

1. An electronic apparatus, comprising:
a first die;
a second die;
a third die;
a fourth die, wherein the second die and the third die are interposed between the first die and the fourth die, and a portion of the second die and a portion of the third die are movably coupled between the first die and the fourth die;
at least one actuator operable to hold a position of the portion of the third die relative to the fourth die; and
the portion of the second die is operable to move while the portion of the third die is held in the position, wherein the movement of the portion of the second die is measured based on a change in distance or overlap between passive components on the first die and the portion of the second die.

2. The electronic apparatus of claim 1, wherein the portion of the second die and the portion of the third die are movable in any X, Y, or Z direction or combination thereof relative to the first die and the fourth die.

3. The electronic apparatus of claim 1, wherein the portion of the second die and the portion of the third die are movable independently from each other.

4. The electronic apparatus of claim 1, further comprising:
a capacitive sensor including passive components on at least two of the first, second, third and fourth dies, wherein the capacitive sensor is operable to measure a change in capacitance caused by a change in overlap between the passive components due to lateral movement of at least one of the portion of the second die and the portion of the third die.

5. The electronic apparatus of claim 1, wherein the first die, the second die, the third die, and the fourth die are bonded together in a stacked arrangement.

6. The electronic apparatus of claim 1, further comprising:
an internal cavity formed between the first die and the fourth die, wherein the portion of the second die and the portion of the third die are located within the internal cavity.

7. The electronic apparatus of claim 6, further comprising:
a seal sealing at least one dielectric in the internal cavity.

8. The electronic apparatus of claim 7, further comprising:
a capacitive sensor operable to determine a position of the portion of the second die relative to the portion of the third die.

9. The electronic apparatus of claim 1, further comprising:
a via in the second die, the via in the second die providing a path for electrical signals traveling through the second die; and
a via in the third die, the via in the third die providing a path for electrical signals traveling through the third die.

10. The electronic apparatus of claim 9, further comprising:

a first circuit; and
a second circuit, wherein the first circuit and the second circuit are in electrical communication with each other using at least one of the via in the second die and the via in the third die.

11. The electronic apparatus of claim 10, wherein the first circuit and the second circuit comprise:
active or passive components on one of an upper surface and a lower surface of the first through the fourth dies.

12. The electronic apparatus of claim 10, wherein the first circuit comprises:
mover electronics operable to control a movement of the portion of the second die and the portion of the third die in a microelectromechanical system device.

13. The electronic apparatus of claim 10, wherein at least one of the first circuit and the second circuit comprises:
transducer electronics and electrodes comprising capacitive plates, wherein at least one of the electrodes is on one of the portion of the second die and the portion of the third die, the transducer electronics being operable to detect relative movement of the portion of the second die to the portion of the third die held stationary by detecting a change in capacitance between the capacitive plates.

14. The electronic apparatus of claim 13, wherein the transducer electronics are operable to detect the relative movement in one or more of the x, y, and z directions.

15. The electronic apparatus of claim 10, further comprising:
a third circuit, wherein the third circuit is in electrical communication with at least one of the first circuit and the second circuit using at least one of the via in the second die and the via in the third die.

16. The electronic apparatus of claim 15, wherein the third circuit comprises:
mover electronics operable to control a movement of the portion of the third die in a MEMS device.

17. The electronic apparatus of claim 1, further comprising:
at least a first electrode disposed on one of the first die, the second die, the third die, or the fourth die; and
at least a second electrode disposed on an adjacent die to the die having the at least a first electrode, wherein the at least a first and the at least a second electrodes are configured to sense a position of the portion of the second die or a position of the portion of the third die or both relative to each other or to the first and/or fourth dies.

18. The electronic apparatus of claim 1, further comprising:
at least a first electrode disposed on one of the first die, the second die, the third die, or the fourth die; and
at least a second electrode disposed on an adjacent die to the die having the at least a first electrode, wherein the at least a first and the at least a second electrodes are configured to hold a position or to change the position of the portion of the second die or to hold or change a position of the portion of the third die or both relative to each other or to the first and/or fourth dies.

19. An electronic apparatus comprising:
a first die;
a second die;
a third die;
a fourth die, wherein the second die and the third die are interposed between the first die and the fourth die, and a portion of the second die and a portion of the third die are movably coupled between the first die and the fourth die;
a first set of electrodes on a surface of the portion of the third die; and
a second set of electrodes facing the first set of electrodes and being provided on a surface of the fourth die, such that a voltage source is operable to generate a voltage in the first and second set of electrodes for generating an electrostatic force between the first and second set of electrodes in a cavity, the electrostatic force holding the portion of the third die stationary.

20. An electronic apparatus comprising:
a first die;
a second die;
a third die; and
a fourth die, wherein the second die and the third die are interposed between the first die and the fourth die, and a portion of the second die and a portion of the third die are movably coupled between the first die and the fourth die, wherein the portion of the second die and the portion of the third die have different masses.

21. A microelectromechanical system (MEMS) device comprising:
a first die;
a second die;
a third die;
a fourth die, wherein a portion of the second die and a portion of the third die are movably connected between the first die and the fourth die;
material bonding the first die, the second die, the third die and the fourth die together;
a via in the second die, the via in the second die providing a path for electrical signals traveling through the second die; and
a via in the third die, the via in the third die providing a path for electrical signals traveling through the third die;
a first circuit on the first die;
a second circuit on the fourth die, wherein the first circuit is in electrical communication with the second circuit by transmitting the electrical signals using the vias in the second die and the third die; and
a first set of active or passive circuit components on at least one of an upper surface and a lower surface of the second die;
a second set of active or passive circuit components on at least one of an upper surface and a lower surface of the third die; and
at least one actuator operable to hold the moveable portion of the third die stationary such that movement of the moveable portion of the second die is operable to be measured relative to the moveable portion of the third die.

22. The MEMS device of claim 21, wherein at least one of the first circuit and the second circuit comprises:
transducer electronics and electrodes comprising capacitive plates, wherein at least one of the electrodes is on one of the portion of the second die and the portion of the third die, the transducer electronics being operable to detect relative movement of the portion of the second die and the portion of the third die by detecting a change in capacitance between the capacitive plates.

23. The MEMS device of claim 22, wherein the portion of the second die and the portion of the third die have the same mass.

24. The MEMS device of claim 22, wherein the portion of the second die and the portion of the third die have different masses.

25. The MEMS device of claim 22, wherein the transducer electronics is operable to detect the relative movement in one or more of the x, y, and z directions.

26. The MEMS device of claim 25, wherein the relative movement is in response to an external force.

27. The MEMS device of claim 21, wherein the first die, the second die, the third die and the fourth die together are bonded together in a vertically stacked arrangement.

28. The MEMS device of claim 21, wherein at least one of the first circuit and the second circuit comprise:
   mover electronics operable to control a movement of the portion of the second die and the portion of the third die in a MEMS device.

29. The MEMS device of claim 21, further comprising:
   a read/write mechanism on the first die;
   a read/write mechanism electronics on at least the first die; and
   a storage media on the second die opposite the read/write mechanism, wherein
   the read/write mechanism electronics is operable to control the read/write mechanism to read, write or access bits from the storage media.

30. The MEMS device of claim 29, wherein the read/write mechanism comprises:
   at least one of field emitter tips, optical emitters, and microcantilevers.

31. The MEMS device of claim 21, further comprising:
   a fifth die, wherein a portion of the fifth die is movably connected between the first die and the fourth die, and wherein the material further bonds the fifth die together with the first die, the second die, the third die and the fourth die.

32. A MEMS device comprising:
   four dies connected together in a stacked arrangement, the stacked arrangement including:
   a first die of the four dies;
   a second die of the four dies connected below the first die in the stacked arrangement, the second die including a moveable portion;
   a third die of the four dies connected below the second die in the stacked arrangement, the third die including a second moveable portion; and
   a fourth die of the four dies connected below the third die in the stacked arrangement, wherein the four dies are connected using a bonding material such that a cavity is formed between the first die and the fourth die and the moveable portions are operable to move in the cavity;
   at least one actuator comprising passive components on the second moveable portion and the fourth die, the at least one actuator being operable to hold the second moveable portion stationary such that movement of the first moveable portion is operable to be measured relative to the second moveable portion.

* * * * *